(12) United States Patent
Mulfinger et al.

(10) Patent No.: US 9,917,103 B1
(45) Date of Patent: Mar. 13, 2018

(54) DIFFUSION BREAK FORMING AFTER SOURCE/DRAIN FORMING AND RELATED IC STRUCTURE

(71) Applicant: GLOBALFOUNDRIES INC., Grand Cayman (KY)

(72) Inventors: George R. Mulfinger, Gansevoort, NY (US); Jin Z. Wallner, Albany, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/397,978

(22) Filed: Jan. 4, 2017

(51) Int. Cl.
| H01L 29/66 | (2006.01) |
| H01L 27/12 | (2006.01) |
| H01L 29/06 | (2006.01) |
| H01L 21/762 | (2006.01) |
| H01L 21/84 | (2006.01) |
| H01L 29/417 | (2006.01) |
| H01L 29/40 | (2006.01) |

(52) U.S. Cl.
CPC .... *H01L 27/1203* (2013.01); *H01L 21/76224* (2013.01); *H01L 21/84* (2013.01); *H01L 29/0649* (2013.01); *H01L 29/401* (2013.01); *H01L 29/41783* (2013.01); *H01L 29/66545* (2013.01)

(58) Field of Classification Search
CPC ....... H01L 29/66545; H01L 21/823431; H01L 27/0886; H01L 21/823481; H01L 29/66795; H01L 29/7848; H01L 21/76224; H01L 27/0924; H01L 29/785; H01L 29/0649; H01L 21/823821; H01L 21/823878; H01L 21/823; H01L 29/0847; H01L 29/7851; H01L 21/02164; H01L 21/823412; H01L 21/823418; H01L 21/823425; H01L 21/823814; H01L 29/0673; H01L 29/6656; H01L 21/762; H01L 21/823857; H01L 29/0657; H01L 21/31053; H01L 21/31116; H01L 29/1083; H01L 27/1203; H01L 21/84; H01L 29/401; H01L 29/41783
See application file for complete search history.

(56) References Cited

U.S. PATENT DOCUMENTS

| 8,609,510 B1 * | 12/2013 | Banna .............. H01L 29/66545 |
| | | 257/E21.409 |
| 9,362,181 B1 * | 6/2016 | Xie ................ H01L 21/823878 |
| 9,589,970 B1 * | 3/2017 | Tseng ............... H01L 27/11206 |
| 9,608,062 B1 * | 3/2017 | Tseng ................ H01L 29/0653 |
| 9,716,042 B1 * | 7/2017 | Basker ............ H01L 21/823431 |

(Continued)

*Primary Examiner* — Bac Au
(74) *Attorney, Agent, or Firm* — Yuanmin Cai; Hoffman Warnick LLC

(57) ABSTRACT

Methods of forming a diffusion break are disclosed. The method includes forming a diffusion break after source/drain formation, by removing a gate stack of the dummy gate to a buried insulator of an SOI substrate, creating a first opening; and filling the first opening with a dielectric to form the diffusion break. An IC structure includes the diffusion break in contact with an upper surface of the buried insulator. In an optional embodiment, the method may also include simultaneously forming an isolation in an active gate to an STI in the SOI substrate.

18 Claims, 8 Drawing Sheets

(56) References Cited

U.S. PATENT DOCUMENTS

| | | | |
|---|---|---|---|
| 2015/0294969 A1* | 10/2015 | Lee | H01L 27/0886 257/401 |
| 2016/0111320 A1* | 4/2016 | Shen | H01L 21/76232 257/401 |
| 2016/0379886 A1* | 12/2016 | Kim | H01L 21/823431 438/283 |
| 2017/0141211 A1* | 5/2017 | Xie | H01L 29/66545 |

* cited by examiner

United States Patent 9,917,103 B1

DIFFUSION BREAK FORMING AFTER SOURCE/DRAIN FORMING AND RELATED IC STRUCTURE

BACKGROUND

The present disclosure relates to field effect transistors (FETs), and more specifically, to methods of forming a diffusion break after source/drain formation and a related IC structure.

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (with both n-type MOS (NMOS) and p-type MOS (PMOS) transistors) are employed. FETs may take a variety of forms and configurations. For example, among other configurations, FETs may be either so-called planar FET devices or three-dimensional (3D) devices, such as finFET devices.

A field effect transistor (FET), irrespective of whether an NMOS transistor or a PMOS transistor is considered and irrespective of whether it is a planar or 3D finFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode together may sometimes be referred to as the gate stack for the device. By applying an appropriate voltage to the gate electrode, the channel region becomes conductive and current is allowed to flow from the source region to the drain region. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit, device designers have greatly reduced the physical size of FETs over the years. More specifically, the channel length of FETs can be scaled down significantly (i.e., channel length decreased), which can improve the switching speed of FETs but lead to leakage (short channel effect). When scaling the overall dimensions of a FET, the isolation between devices must also shrink which results in device degradations beyond that of traditional short channel effects.

FIG. 1 is a side view of an illustrative prior art FET semiconductor device 10 that is formed above a semiconductor substrate 12. Substrate 12 may include a semiconductor-on-insulator (SOI) substrate including a semiconductor-on-insulator (SOI) layer 14 (e.g., silicon or silicon germanium (SiGe)), an insulator layer 16 (e.g., of silicon oxide) thereunder and a semiconductor substrate 18 thereunder. In this example, FET device 10 includes a gate structure 22, sidewall spacers 24, and a gate cap 26. Gate structure 22 is typically comprised of a layer of insulating material (not separately shown), e.g., a layer of high-k insulating material or silicon dioxide, and one or more conductive material layers (e.g., metal, metal nitride, and/or polysilicon) that serve as the gate electrode and work-function layers (for setting threshold voltage (Vt)) for device 10. A stress may be imparted to SOI layer 14 to create a stress in channel region 30 to improve performance of the device created therefrom. For example, a compressive stress may be imparted in SiGe of SOI layer 14 where device 10 is to be a p-type FET, which increases hole mobility and device performance. Alternatively, a tensile stress may be imparted to Si in SOI layer 14 where device is to be an n-type FET.

FIG. 2 illustrates a cross-sectional view of a number of FET devices 10 with a diffusion break 32 therebetween, under a dummy gate 34. Diffusion break 32 acts to isolate FET devices 10 from one another. A diffusion break 32 having a lateral width corresponding to the lateral width of one gate structure 34, as shown, is referred to as a single diffusion break (SDB). The specific process for forming SDB 32 may include intentionally gouging SOI substrate 12 to define a recess 36. As illustrated, each diffusion break 32 includes an isolation region made of a dielectric. Shallow trench isolations (STI) 38, i.e., trenches filled with dielectric, may also be employed to isolate different device regions. As gate pitches become smaller with decreasing sizes of FET devices, maintaining the stress in channel region 30 becomes more difficult. In particular, formation of diffusion breaks 32 and/or STI 38 within SOI layer 14 may release the stress in SOI layer 14, degrading performance of the FET device formed therefrom. This degradation is even more significant on fully depleted SOI (FDSOI) where SOI layer 14, i.e., channel thickness, is very thin (e.g., 5-20 nm) and vulnerable to the strain loss.

FIG. 3 shows processes to create raised source/drain regions. FIG. 3 illustrates devices 10 after a spacer etch process was performed to recess SOI layer 14 using gate structure 37 and spacer 39 of dummy gate 34 as an etch mask to define recesses 40 in SOI layer 14. It is understood that "recess" in the setting of SOI layer 14 is relatively shallow because SOI layer 14 is very thin, e.g., 5-20 nm. FIG. 3 also illustrates devices 10 after an epitaxial growth process was performed to define epitaxial regions 42 in recesses 40 for source/drain regions 44 of devices 10. In some instances, such as with fully depleted SOI (FDSOI) source/drain regions 44 are raised compared to a top surface of SOI layer 14. Another challenge related to SDB formation is the poor epitaxial growth that may result along SDB 32, resulting in a variety of defects such as agglomerations, reduced growth from facet formation, defective shapes, etc. The epi defects can cause contact punch through among other issues. In any event, the poor epitaxial growth at a boundary of SDB 32 degrades device 10 performance by, for example, reducing the volume of dopant and by reducing strain. To address the problem, some processes prohibit SDB for FDSOI substrates because of the pFET performance degradations, which limits active region isolations. These approaches may employ dummy gates to isolate devices or may cut gates to isolate different structures, which requires turning off a particular gate, e.g., by forming an isolation within a selected active gate. Some of these approaches employ complex interconnections to avoid using SDBs with pFETs. These latter approaches have limited applications at advanced technology nodes, e.g., 22 nm and beyond, due to patterning issues with the tighter pitches (spacing) required. For example, it becomes exceedingly difficult to enlarge dummy gates to contact within a tight array of active gates.

SUMMARY

A first aspect of the disclosure is directed to a method of forming a diffusion break, the method including: providing a structure including a semiconductor-on-insulator (SOI) substrate having a plurality of active gates and a dummy gate between a selected pair of active gates of the plurality of active gates, and a raised source/drain region between each of the selected pair of active gates and the dummy gate; and then, forming the diffusion break by: removing a gate stack of the dummy gate to a buried insulator of the SOI substrate, creating a first opening; and filling the first opening with a dielectric to form the diffusion break, the diffusion break in contact with an upper surface of the buried insulator.

A second aspect of the disclosure includes a method including: providing a fully depleted semiconductor-on-insulator (FDSOI) substrate including: a plurality of gates in a semiconductor-on-insulator (SOI) layer of the FDSOI substrate, the plurality of gates including: a plurality of active gates including a selected pair of active gates, each of the selected pair of active gates including a channel region having a compressive strain therein, and a dummy gate between the selected pair of active gates, a raised source/drain region adjacent each active gate and between each of the selected pair of active gates and the dummy gate, and a shallow trench isolation (STI) gate cut region including an STI in the FDSOI substrate below a portion of a selected active gate of the plurality of active gates; forming a silicide using a silicide mask covering the dummy gate and the STI gate cut region; depositing an contact etch stop layer; forming a dielectric layer that exposes the contact etch stop layer selectively over a gate stack of the dummy gate and the contact etch stop layer over the selected active gate over the STI gate cut region; etching the contact etch stop layer to expose the gate stack of the dummy gate and expose the selected active gate in the STI gate cut region; etching to: remove the gate stack of the dummy gate to a buried insulator of the FDSOI substrate, creating a first opening, and remove a gate stack of the selected active gate to the STI, creating a second opening, and filling the first opening and the second opening with a dielectric to form a diffusion break to the buried insulator layer in the first opening and an isolation in the selected active gate to the STI in the second opening.

A third aspect of the disclosure related to an integrated circuit (IC) structure, including: a semiconductor-on-insulator (SOI) substrate including an SOI layer over a buried insulator; a pair of first active gates formed with the SOI layer; a dummy gate formed with the SOI layer between the pair of first active gates; and a diffusion break positioned below the dummy gate, the diffusion break extending to an upper surface of the buried insulator.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
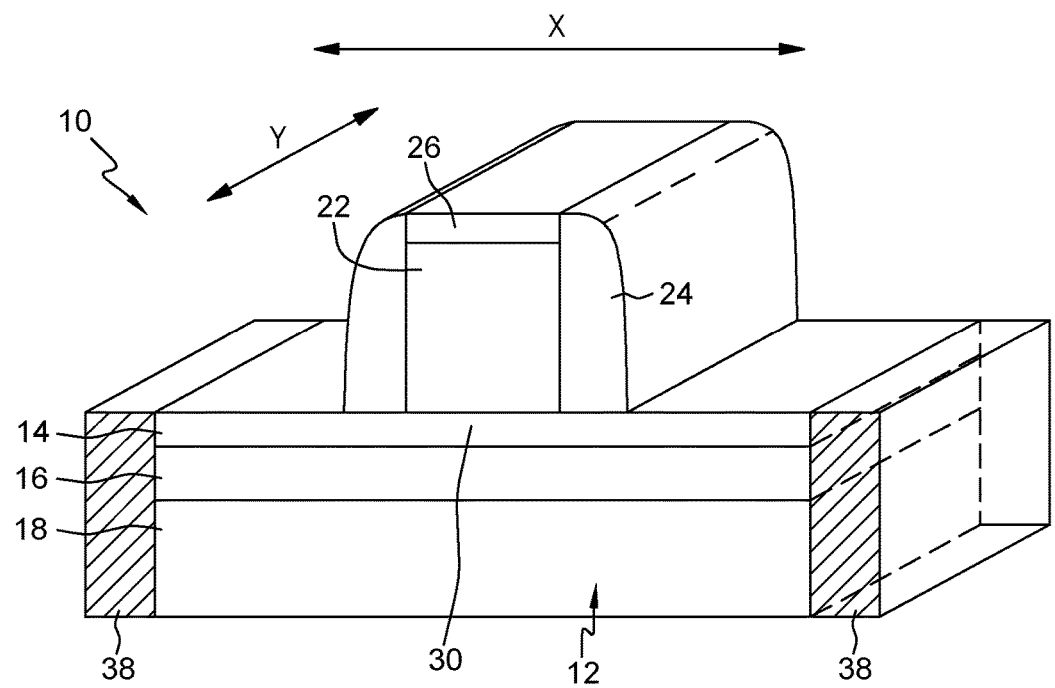
FIG. 1 shows a perspective view of a FET according to the prior art.

Methods of forming a diffusion break after source/drain formation in an IC structure are disclosed herein. Formation of the diffusion break, as described herein, aids in retaining stress in the semiconductor-on-insulator (SOI) layer upon or in which active devices are formed, which results in better FET performance. In an optional embodiment, the method may also include steps to form an isolation in a selected active gate simultaneously with formation of the diffusion break. An IC structure formed according to the embodiments of the disclosure results in an active region diffusion break that extends to an upper surface of the buried insulator layer, and, optionally, an isolation in the active device gate that extends to an STI in the SOI substrate.

In the drawings described hereafter, the even numbered figures shows an X-cut of the structure including a cross-section of gates, and the odd numbered figures show a Y-cut of the structure including a side view of the gates. It is emphasized that the even numbered figures are at one location of the IC structure and the odd numbered figures are at another location, i.e., the different cross-sections do not necessarily show the same gates. More particularly, the even numbered figures show processing at a location that is to include a diffusion break and the odd numbered figures show optional processing at a location to include an isolation in a selected active gate that is typically distanced from the diffusion break.

Figure 4:
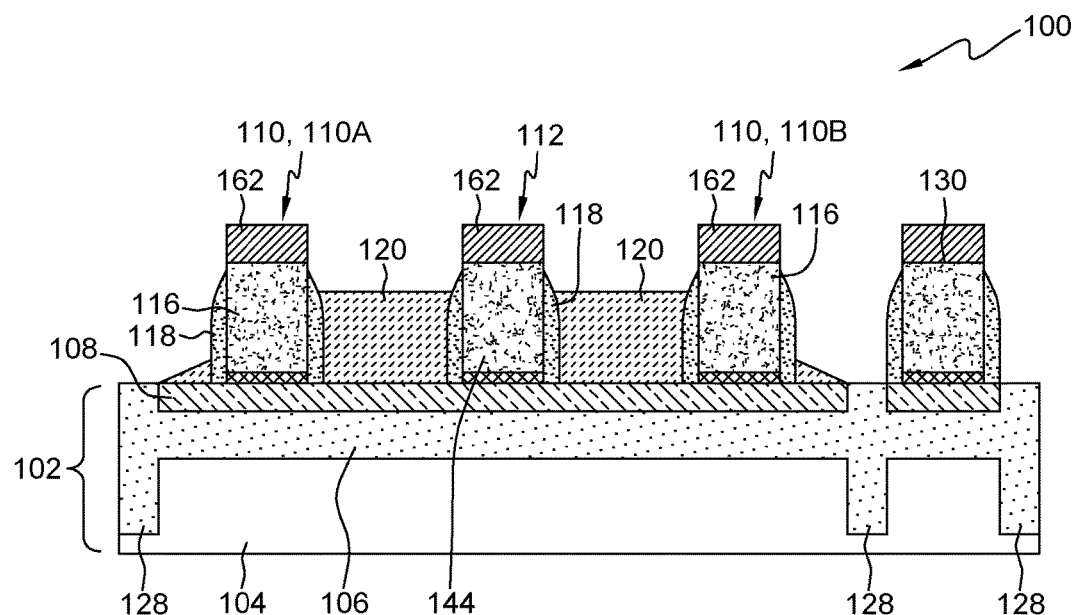
FIG. 4 shows a cross-sectional view of a preliminary structure for a method of forming an IC structure having a diffusion break according to embodiments of the disclosure.
Figure 5:
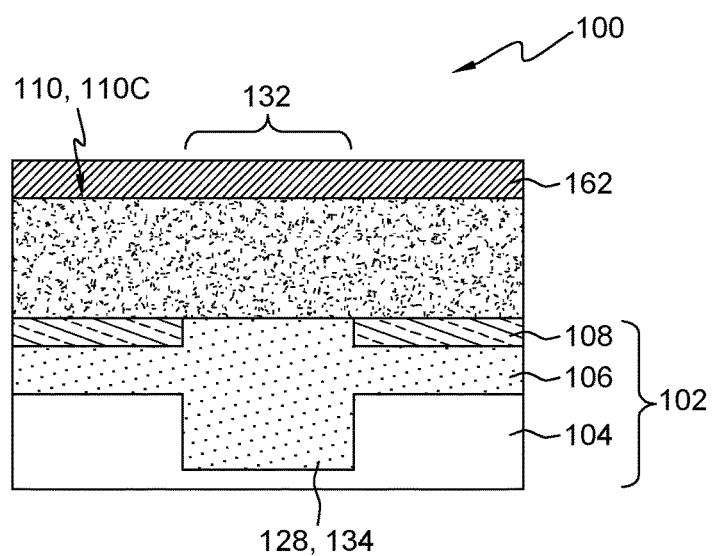
FIG. 5 shows another cross-sectional view of the preliminary structure for a method of forming an IC structure including an isolation in an active gate according to an optional embodiment of the disclosure.

Referring to the drawings, FIGS. 4 and 5 shows cross-sectional views of a preliminary structure 100. Preliminary structure 100 includes a semiconductor-on-insulator (SOI) substrate 102. SOI substrate 102 includes a semiconductor substrate 104, a buried insulator layer 106 and an SOI layer 108. Semiconductor substrate 104 and SOI layer 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of SOI layer 108 may be strained. For example, as will become apparent herein, the teachings of the disclosure are particularly applicable to formation of p-type FETs that include a compressive stress imparted to SOI layer 108. It is emphasized, however, that the teachings of the disclosure may also be applicable to n-type FETs that include a tensile stress imparted to SOI layer 108. Furthermore, in one embodiment, SOI substrate 102 may include a fully depleted SOI substrate (FDSOI), including a thin buried insulator 106 and a very thin SOI layer 108, i.e., sufficiently thin so the depletion region in the channel covers the entirety of the layer. FDSOI is also beneficial to formation of p-type FETs. Buried insulator 106 may include any now known or later developed dielectric appropriate for SOI substrate including but not limited to silicon dioxide (forming buried oxide (BOX)) or sapphire.

SOI substrate 102 may be formed using any now known or later developed process, e.g., by deposition, separation by implantation of oxygen (SIMOX), wafer bonding, etc. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating and/or evaporation.

Figure 2:
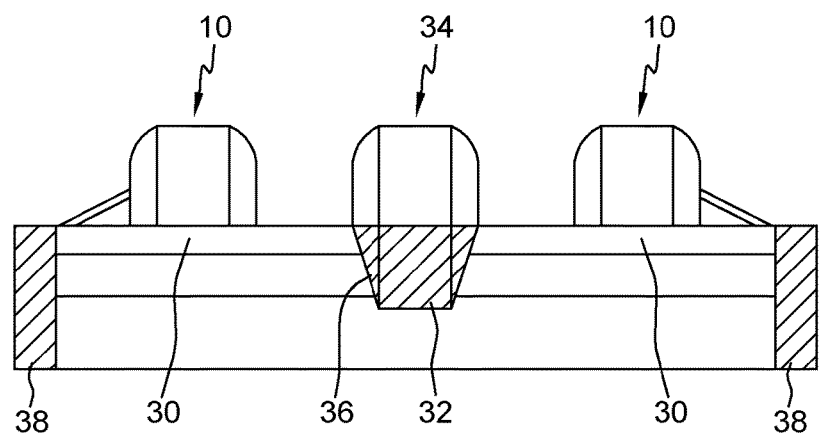
FIG. 2 shows a cross-sectional view of a FET with a diffusion break according to the prior art.
Figure 3:
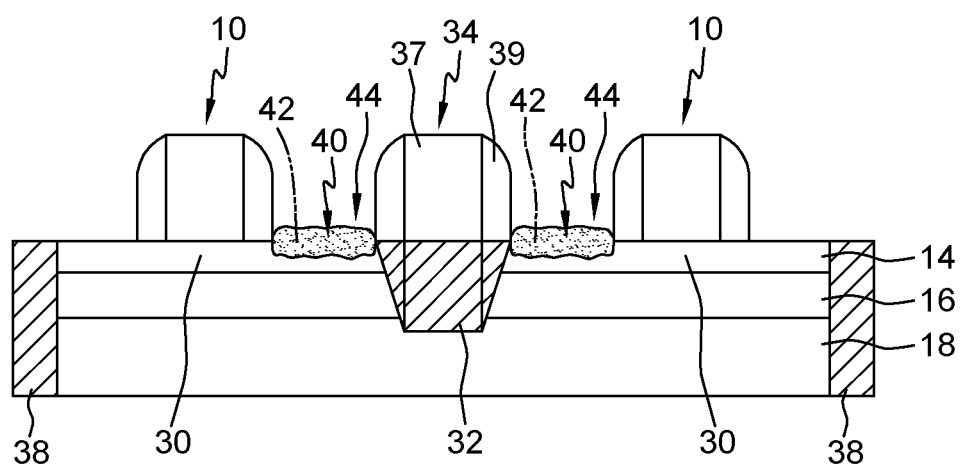
FIG. 3 shows a cross-sectional view of a formation of source/drain regions for a number of FETs with a diffusion break, according to the prior art.

Preliminary structure 100 may also include a plurality of active gates 110 (110A, 110B, 110C) and a dummy gate 112. As understood in the art, SOI layer 108 may have (as in FIG. 2) one or more gates 110, 112 formed thereover, e.g., of a metal or polysilicon. Each gate 110, 112 may include a gate stack 116, 144, respectively, surrounded at least in part by a spacer 118, e.g., of silicon nitride. The material of gate stacks 116 of each gate 110, 112 may vary. For example, if a replacement metal gate process is employed, active gates 110 may not include their final material at this stage, i.e., they may include a polysilicon rather than a metal. Alternatively, active gates 110 may include their final gate stack materials (as shown), e.g., thin gate dielectric lower layer and metal body thereover. A gate stack 144 of dummy gate 112 may include any sacrificial material desired, e.g., polysilicon. Active gates 110 are so termed because they will eventually form functional FETs, and dummy gate 112 is so termed because it will not form a FET and are located where a diffusion break 142 (FIG. 14) is desired. As shown, dummy gate 112 is positioned between a selected pair of active gates 110A, 110B of the plurality of active gates 110 such that a diffusion break formed therewith will isolate active devices 110A, 110B.

Gates 110, 112 may be formed using any now known or later developed technique such as but not limited to photolithography, sidewall image transfer, etc. In lithography (or "photolithography"), for example, a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. Common masking materials are photoresist (resist) and nitride. Nitride is usually considered to be a "hard mask." In FIGS. 4 and 5, a gate hard mask 162 is shown remaining over gates 110, 112. Gate hard mask 162 is used to pattern gates 110, 112, and may be left in place to protect those structures during subsequent processing.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Preliminary structure 100 also includes at this stage, in contrast to conventional processing for diffusion breaks, a raised source/drain region 120 between each of selected pair of active gates 110A, 110B and dummy gate 112. Raised source/drain (RSD) region 120 may be formed using any now known or later developed technique. For example, RSD region 120 may be formed by doping a portion of SOI layer 108 between gates with a dopant. For n-type devices, an n-type dopant may be used, which may include but is not limited to: phosphorous (P), arsenic (As), antimony (Sb). For a p-type device, p-type dopants are used, which may include but are not limited to: boron (B), indium (In) and gallium (Ga). As will become apparent herein, the teachings of the disclosure are particularly applicable to formation of p-type FETs that include a compressive stress imparted to SOI layer 108. Consequently, a dopant used in RSD region 120 may include a p-type dopant to allow the method to create a pFET. As noted, the teachings of the disclosure may also be applicable to n-type FETs that include an n-type dopant to create an nFET. In addition thereto or as an alternative, an epitaxial growth process may be performed to create source/drain region in an etched out area adjacent the gates and/or to raise the source drain regions along a side of gates 110, 112. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the surface from which grown. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Epitaxial growth processes may be selective to forming on semiconductor surfaces, and may not deposit material on dielectric surfaces, such as silicon dioxide or silicon nitride surfaces. RSD region 120 may be doped in-situ during formation or ion implanted thereafter.

Figure 14:
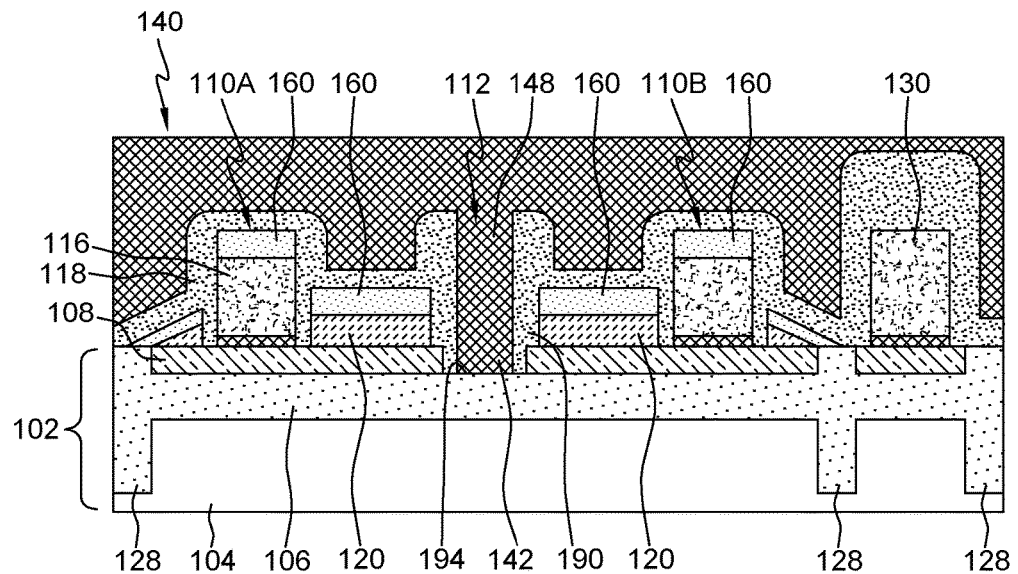
FIG. 14 shows a cross-sectional view of formation of an IC structure including a diffusion break according to embodiments of the disclosure, and an embodiment of the IC structure so formed.

As also shown in FIGS. 4 and 5, preliminary structure 100 also may include any number of shallow trench isolations (STI) 128. As known in the field, STIs 128 are formed by creating a trench etched into SOI substrate 102 and filled (e.g., by depositing) with an insulating material such as oxide, to isolate one region of SOI substrate 102 from an adjacent region of the SOI substrate. One or more active devices of a given polarity may be disposed within an area isolated by an STI. For example, active device gates 110A, 110B and dummy gate 112 are isolated from a resistor 130 and another active gates (not shown) by STIs 128. FIG. 5 shows an STI gate cut region 132 including an STI 134 in SOI substrate 102 below a portion of a selected active gate 110C of the plurality of active gates. STI gate cut region 132 is so termed because it is a region under a selected active gate 110C at which the gate will be cut or broken over an STI 134. It is noted that selected active gate 110C may be active gate 110A or 110B but in another location than that shown in the even number figures, i.e., where selective active gate 110C crosses STI 134. It is noted that selected active gate 110C is shown in longitudinal direction, not in transverse-to-gate direction of the even numbered figures, where it may be cut over STI 134. As will be further described, it is in this STI gate cut region 132 that an isolation within active gate 110C may be optionally formed simultaneously with formation of a diffusion break 142 (FIG. 14). (The isolation is oftentimes referred to as a 'PC cut' because it cuts the gate of an active device). It is understood that formation of an isolation within an active gate 110C is conventionally performed when active gates 110C are patterned, i.e., using a gate cut mask during gate patterning to break the active gate 110C. According to optional embodiments of the disclosure, however, the gate cut mask and patterning used to cut active device 110C are omitted.

As noted, preliminary structure 100 also may include an optional resistor 130. Resistor 130 is shown to detail how the teachings of the disclosure interact with such structure when present. Resistor 130 may include any now known or later developed IC resistor material and/or structure.

Figure 15:
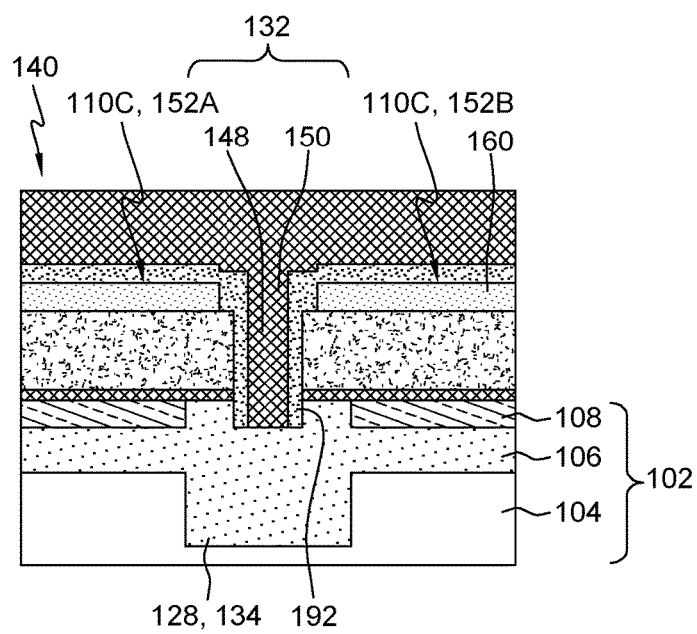
FIG. 15 shows another cross-sectional view of formation of an IC structure including an isolation in an active gate according to optional embodiments of the disclosure, and an embodiment of the IC structure so formed.

FIGS. 6-15 show forming an IC structure 140 (FIGS. 14-15) including a diffusion break 142 (FIG. 14) according to embodiments of the disclosure. In contrast to conventional processing, diffusion break 142 (FIG. 14) is formed after RSD region 120 and, as will be described herein, is self-aligned beneath dummy gate 112. In general terms, as shown in FIGS. 6-15, diffusion break 142 (FIG. 14) may be formed by: removing a gate stack 144 of dummy gate 112 to buried insulator 106 of SOI substrate 102, creating a first opening 182 (FIG. 12), and then filling first opening 182 (FIG. 12) with a dielectric 148 (FIG. 14) to form diffusion break 142 (FIG. 14). In an optional embodiment, as noted, an isolation 150 (FIG. 15) may be formed in STI gate cut region 132, simultaneously with forming diffusion break 142. That is, isolation 150 (FIG. 15) is formed in a selected active gate 110C of the plurality of active gates 110. Isolation 150 (FIG. 15) separates the selected active gate 110C into two isolated active gate portions 152A, 152B (FIG. 15). As illustrated, in FIG. 15, isolation 150 is positioned over STI 134 in STI gate cut region 132.

With reference to FIGS. 6-15, details of embodiments of a method according to the disclosure will be now described. It is emphasized that the teachings of the even numbered figures, i.e., 6, 8, 10, 12 and 14, may be carried out according to embodiments of the disclosure without performing the optional processes shown in the odd numbered figures, i.e., 7, 9, 11, 13 and 15.

Figure 6:
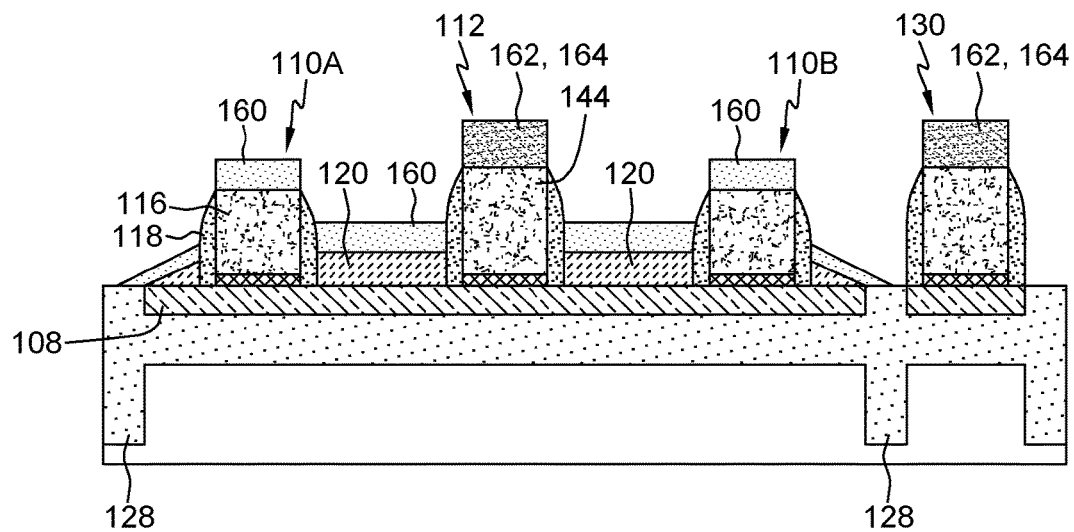
FIG. 6 shows a cross-sectional view of formation of an IC structure including a diffusion break according to embodiments of the disclosure.
Figure 7:
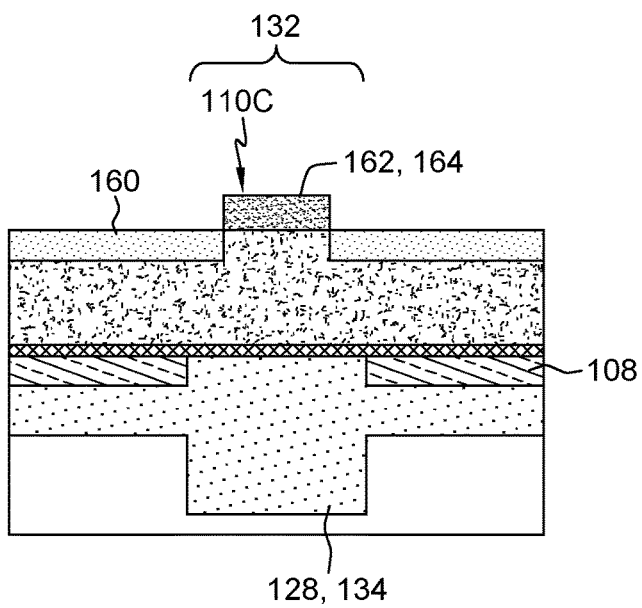
FIG. 7 shows another cross-sectional view of formation of an IC structure including an isolation in an active gate according to optional embodiments of the disclosure.

FIGS. 6-7 show forming a silicide 160 using a silicide mask 164, which may be formed by removing remaining portions of gate hard mask 162 (FIGS. 4-5), e.g., by etching, over areas in which silicide is desired, e.g., over active gates 110. Silicide mask 164 may include the same hard mask material as gate hard mask 162 since it is formed therefrom. As illustrated, silicide mask 162 protects any area for which silicide is not desired including over dummy gate 112 and, where isolation 150 (FIG. 15) is desired, i.e., over STI gate cut region 132 (FIG. 7). Optionally, where polysilicon resistor 130 is provided, silicide mask 164 may also cover polysilicon resistor 130 on SOI substrate 102. Silicide 160 may be formed using any now known or later developed technique, e.g., performing an in-situ pre-clean, depositing a metal such as titanium, nickel, cobalt, etc., annealing to have the metal react with silicon/polysilicon, and removing unreacted metal.

Figure 8:
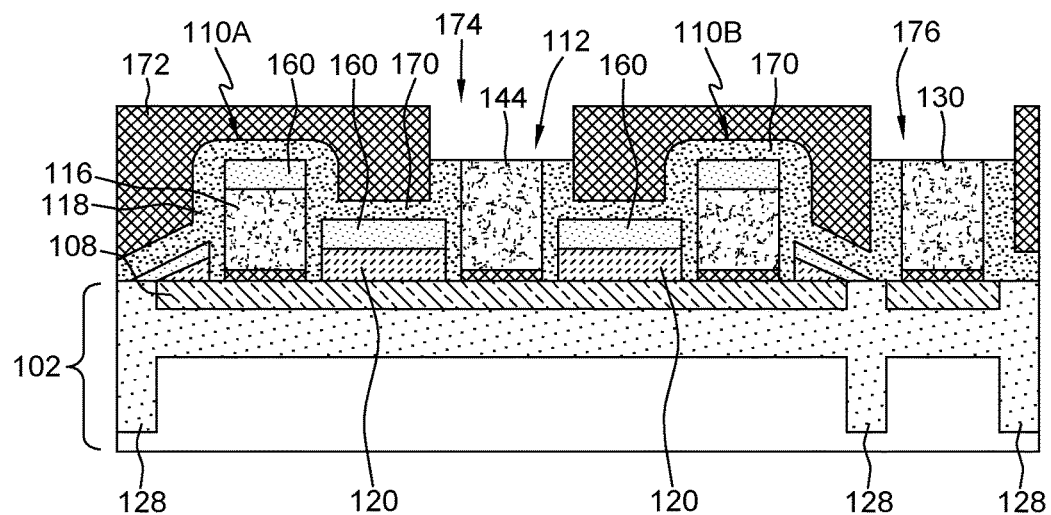
FIG. 8 shows a cross-sectional view of formation of an IC structure including a diffusion break according to embodiments of the disclosure.
Figure 9:
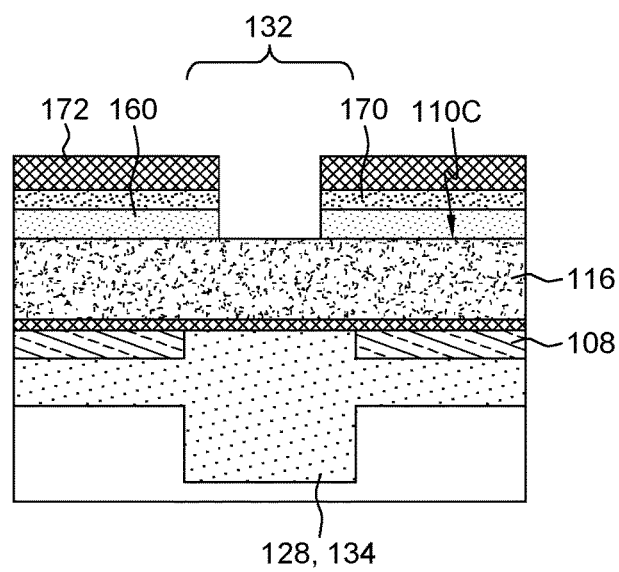
FIG. 9 shows another cross-sectional view of formation of an IC structure including an isolation in an active gate according to optional embodiments of the disclosure.

FIGS. 8-9 show a number of processes including, for example: depositing a contact etch stop layer 170 and then depositing a dielectric layer 172, exposing contact etch stop layer 170 and then etching contact etch stop layer 170 and silicide mask 164 (remaining gate hard mask 162) to expose gate stack 144 of dummy gate 112 and gate stack 116 of selected active gate 110C. Contact etch stop layer 170 may be deposited, and may include any now known or later developed etch stop material such as silicon nitride. Dielectric layer 172 is formed such that, after planarizing, contact etch stop layer 170 is exposed selectively over dummy gate 112 (not shown because later etched) and, optionally, exposes contact etch stop layer 170 over selected active gate 110C over STI 134 in STI gate cut region 132 (not shown because later etched). This process may include depositing dielectric layer 172 and planarizing it to expose contact etch stop layer 170. In this regard, silicide mask 164 (FIGS. 6-7) acts to control the planarization in the desired areas. Dielectric layer 172 may include any now known or later developed interlayer dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar, and can be used to expose contact etch stop layer 170. Other currently conventional planarization techniques may include: (i) oxidation; (ii) chemical etching; (iii) taper control by ion implant damage; (iv) deposition of films of low-melting point glass; (v) re-sputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Continuing with FIGS. 8-9, contact etch stop layer 170 (and any remaining silicide mask 164) exposed by the planarization may be etched selective to dielectric layer 172, e.g., of silicon oxide, using any appropriate etching chemistry to arrive at the structure shown in FIGS. 8-9. Once the etching is complete, gate stack 144 of dummy gate 112 is exposed. Further, where the optional isolation processing is being carried out, gate stack 116 of selected active gate 110C in STI gate cut region 132 may be exposed. The etching creates openings 174, 176 over gate stack 144 of dummy gate 112, and gate stack 116 of selected active gate 110C.

Figure 10:
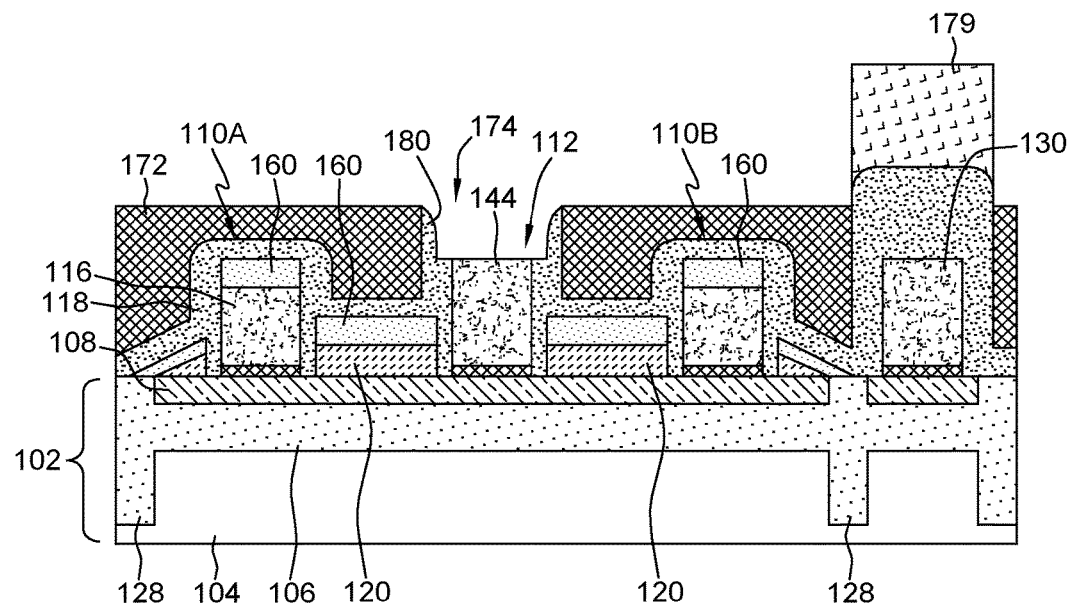
FIG. 10 shows a cross-sectional view of formation of an IC structure including a diffusion break according to embodiments of the disclosure.
Figure 11:
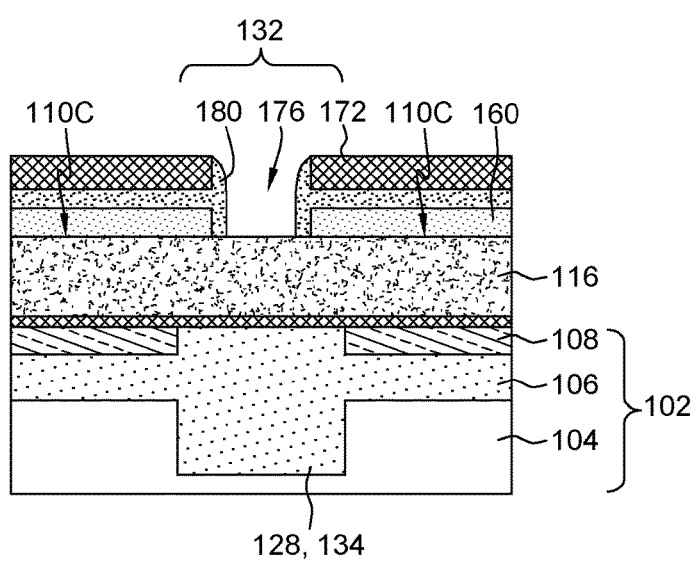
FIG. 11 shows another cross-sectional view of formation of an IC structure including an isolation in an active gate according to optional embodiments of the disclosure.

FIGS. 10-11 show additional processing. As an optional step, a spacer 180 may be formed in opening 176 in dielectric layer 172 in STI gate cut region 132. Spacer 180 may include any now known or later developed spacer material, e.g., silicon nitride. Spacer 180 may be formed, for example, by depositing spacer material and etching. As will be described, spacer 180 acts to control a size of isolation 150 (FIG. 15), and may also be sized to ensure isolation 150 lands on STI 134. Spacer 180 may also be formed in opening 174 over gate stack 144 of dummy gate 112, but it is not necessary. Where a polysilicon resistor 130 is provided, a mask 179 may also be created at this stage to protect polysilicon resistor 130 from subsequent processing. Spacer 180 may also be retained over polysilicon resistor 130 to protect it from the subsequent removal step.

Figure 12:
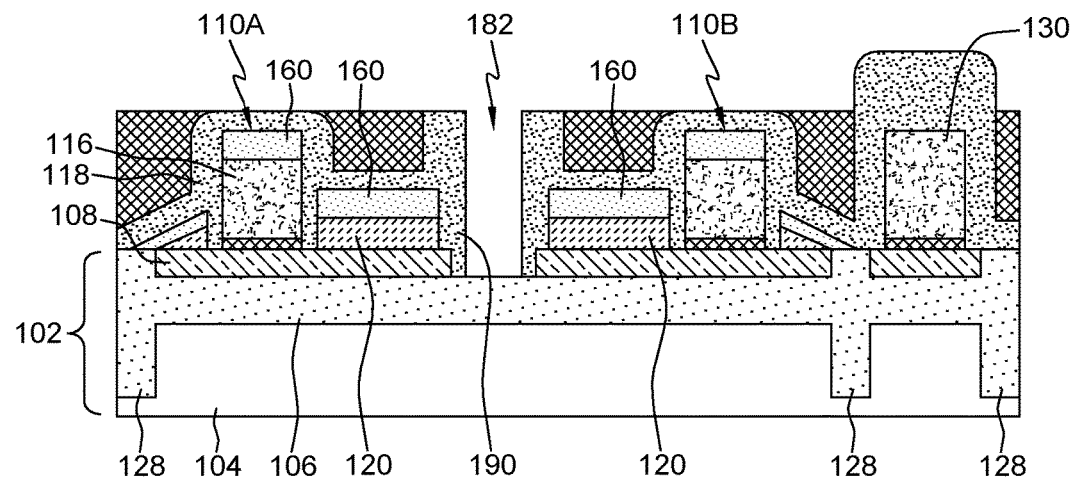
FIG. 12 shows a cross-sectional view of formation of an IC structure including a diffusion break according to embodiments of the disclosure.
Figure 13:
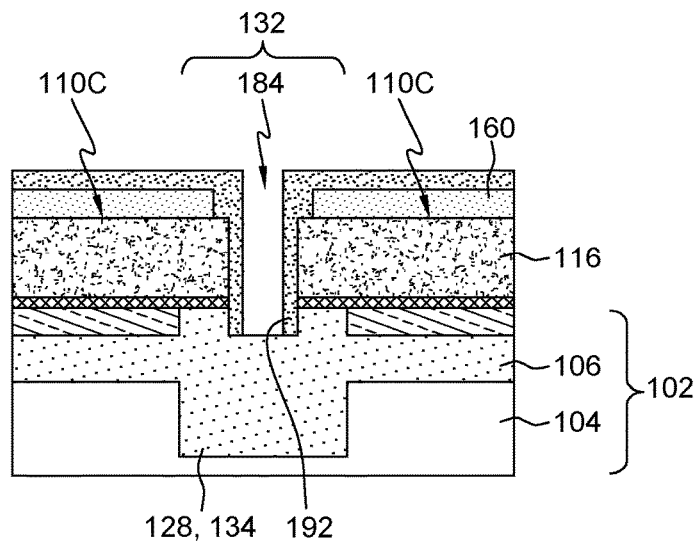
FIG. 13 shows another cross-sectional view of formation of an IC structure including an isolation in an active gate according to optional embodiments of the disclosure.

FIG. 12 shows removing gate stack 144 (FIG. 10) of dummy gate 112 to buried insulator 104, creating a first opening 182. Gate stack 144 (FIG. 10) may be removed using any appropriate etching process for the materials thereof. Where isolation 150 (FIG. 15) is also to be formed, as shown in FIG. 13, gate stack 116 (FIG. 10) of selected active gate 110C may also be removed, i.e., during etching of gate stack 144 of dummy gate 112, to STI 134, creating a second opening 184. This latter process, sometimes referred to as a gate cut, occurring later than conventional processing (i.e., during gate patterning) allows for better encapsulation of metal gate stack 116, and less exposure to front-end-of-line (prior to first metal) clean processing used in other processing. As understood, the width of the removal of gate stack 144 (FIG. 10) and selected active gate 110C is limited by the extent of openings 174, 176 (FIGS. 10 and 11, respectively) in dielectric layer 172, or, where provided, spacer 180.

FIG. 12 also shows an optional step of forming a spacer 190 within first opening 182. Spacer 190 may include any now known or later developed spacer material, e.g., silicon nitride. Spacer 190 may be formed, for example, by depositing spacer material and etching. Spacer 190 acts to maintain any stress within SOI layer 110. At the same time, as shown in FIG. 13, a spacer 192 may also be formed in opening 184 over STI 134. Spacer 192 acts to maintain any stress within SOI layer 110. Spacer 192 also acts to encapsulate gate stack 116 and protect it from oxygen ingress and from other processing, as noted herein.

FIG. 14 shows filling first opening 182 (FIG. 12) with dielectric 148. Dielectric 148 may include any interlayer dielectric listed herein. Dielectric 148 forms diffusion break 142 in SOI layer 110 and otherwise fills opening 182 (FIG. 12), reforming dummy gate 112 over diffusion break 142. In contrast to conventional diffusion breaks, diffusion break 142 is in contact with an upper surface 194 of buried insulator 106. That is, diffusion break 142 does not extend into buried insulator 106.

As shown in FIG. 15, where isolation 150 is also being formed, when first opening 182 (FIG. 12) is filled, second opening 184 (FIG. 13) may also be filled dielectric 148 to form isolation 150 in selected active gate 110C. Isolation 150 is in contact with STI 134, forming a sound isolation between now electrically isolated portions 152A and 152B of selected active gate 110C.

Returning to FIG. 14, FIG. 14 shows one embodiment of IC structure 140 including a diffusion break 142 according to embodiments of the disclosure. In this embodiment, IC structure 140 may include SOI substrate 102 including SOI layer 108 over buried insulator 106. IC structure 140 also includes pair of first active gates 110A, 110B formed with SOI layer 108, e.g., gates thereover, and RSD region 120 in and partially thereover. Dummy gate 112 is formed between pair of first active gates 110A, 110B. Diffusion break 142 is positioned below dummy gate 112 (former above SOI layer 108) and diffusion break 142 extends only to upper surface 194 of buried insulator 106. In contrast to conventional processing, because diffusion break 142 is formed after RSD region 120 formation, diffusion break 142 is self-aligned with dummy gate 112 thereover. As used herein "self-align" means that dummy gate 112 and diffusion break 142 are laterally aligned. Diffusion break 142 also advantageously acts to retain stress in SOI layer 108, which may include, for example, a compressive stress for p-type FETs or a tensile stress for n-type FETs. In particular, the method may provide a larger volume of compressively strained SOI layer 108, e.g., silicon germanium for pFEts, or a larger volume of tensile strained SOI layer 108, e.g., silicon for nFETs, which in either event retains the stress. In the former case, SOI substrate 102 may include FDSOI substrate, and pair of active gates 110A, 110B may each form a p-type field effect transistor, using p-type dopants. In the latter case, pair of active gates 110A, 110B may each form an n-type field effect transistor, using n-type dopants. Diffusion break 142 acts to maintain more of the stress within SOI layer 108, compared to conventional processing. IC structure 140 also includes RSD region 120 between each active gate 110A, 110B and dummy gate 112. Since diffusion break 142 is formed after RSD region 120, RSD region 120 is facet free adjacent diffusion break 142. That is, IC structure 140 does not suffer from defects such as agglomerations, etc. Consequently, it is easier to land a contact on RSD region 120 in subsequent processing without punch through issues to other structure, which can cause shorts. Furthermore, IC structure 140 also avoids the issues observed with avoiding diffusion breaks using continuous active regions and complex interconnections. As a result, IC structure 140 is capable of further decreasing of size, and avoids the poor leakage issues with the prior art structures.

FIG. 15 shows another embodiment of IC structure 140 that includes isolation 150. Here, a selected (second) active gate 110C in another region of SOI substrate 102, isolated from active gates 110A, 110B, may include isolation 150. As described, isolation 150 separates active gate 110C into two isolated active gate portions 152A, 152B. Isolation 150 extends to STI 134 in SOI substrate 102, ensuring electrical isolation of portions 152A, 152B. Spacer 192 may be provided between isolation 150 and each of two isolated active gate portions 152A, 152B to protect metal gate stack 116 thereof.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a diffusion break, the method comprising:
   providing a structure including:
      a semiconductor-on-insulator (SOI) substrate having a plurality of active gates and a dummy gate between a selected pair of active gates of the plurality of active gates,
      a raised source/drain region between each of the selected pair of active gates and the dummy gate; and
      a shallow trench isolation (STI) gate cut region including a STI in the SOI substrate below a portion of a selected active gate of the plurality of active gates;
   forming the diffusion break by:
      removing a gate stack of the dummy gate to a buried insulator of the SOI substrate, creating a first opening; and
      filling the first opening with a dielectric to form the diffusion break, the diffusion break in contact with an upper surface of the buried insulator; and
   forming, simultaneously with the forming the diffusion break, an isolation in the selected active gate of the plurality of active gates, the isolation separating the selected active gate into two isolated active gate portions, and wherein the isolation is positioned over the STI.

2. The method of claim 1, wherein forming the diffusion break and the isolation in the selected active gate includes:
   forming a silicide using a silicide mask covering the dummy gate and the STI gate cut region;
   depositing a contact etch stop layer;
   forming a dielectric layer that exposes the contact etch stop layer selectively over the dummy gate and over the STI gate cut region;
   etching the contact etch stop layer to expose the gate stack of the dummy gate and expose the selected active gate in the STI gate cut region,
   wherein removing the gate stack of the dummy gate also includes removing the selected active gate to the STI, creating a second opening, and wherein filling the first opening with the dielectric includes filling the second opening with the dielectric to form the isolation in the selected active gate, the isolation being in contact with the STI.

3. The method of claim 2, wherein, prior to etching the etch stop layer, forming a spacer in an opening in the dielectric layer in the STI gate cut region.

4. The method of claim 1, further comprising, prior to removing the dummy gate:
forming a silicide using a silicide mask covering the dummy gate;
depositing an contact etch stop layer;
forming a dielectric layer, leaving the contact etch stop layer over the gate stack of the dummy gate exposed; and
etching the contact etch stop layer to expose the gate stack of the dummy gate.

5. The method of claim 4, wherein the silicide mask also covers a polysilicon resistor on the SOI substrate.

6. The method of claim 1, further comprising forming a spacer within the first opening prior to the filling with the dielectric.

7. The method of claim 1, wherein providing the structure further includes imparting a compressive strain in an SOI layer of the SOI substrate used as a channel region for the plurality of active gates.

8. A method comprising:
providing a fully depleted semiconductor-on-insulator (FDSOI) substrate including:
a plurality of gates in a semiconductor-on-insulator (SOI) layer of the FDSOI substrate, the plurality of gates including: a plurality of active gates including a selected pair of active gates, each active gate of the selected pair of active gates including a channel region having a compressive strain therein, and a dummy gate between the selected pair of active gates,
a raised source/drain region adjacent each active gate and between each active gate of the selected pair of active gates and the dummy gate, and
a shallow trench isolation (STI) gate cut region including an STI in the FDSOI substrate below a portion of a selected active gate of the plurality of active gates;
forming a silicide using a silicide mask covering the dummy gate and the STI gate cut region;
depositing an contact etch stop layer;
forming a dielectric layer that exposes the contact etch stop layer selectively over a gate stack of the dummy gate and the contact etch stop layer over the selected active gate over the STI gate cut region;
etching the contact etch stop layer to expose the gate stack of the dummy gate and expose the selected active gate in the STI gate cut region;
etching to: remove the gate stack of the dummy gate to a buried insulator of the FDSOI substrate, creating a first opening, and remove a gate stack of the selected active gate to the STI, creating a second opening, and
filling the first opening and the second opening with a dielectric to form a diffusion break to the buried insulator layer in the first opening and an isolation in the selected active gate to the STI in the second opening.

9. The method of claim 8, wherein the silicide mask also covers a polysilicon resistor.

10. The method of claim 8, further comprising forming a spacer within the first opening prior to the filling with the dielectric.

11. The method of claim 8, wherein, prior to the etching the etch stop layer, forming a spacer in an opening in the dielectric layer in the STI gate cut region.

12. An integrated circuit (IC) structure, comprising:
a semiconductor-on-insulator (SOI) substrate including an SOI layer over a buried insulator;
a pair of first active gates formed with the SOI layer;
a dummy gate formed with the SOI layer between the pair of first active gates;
a diffusion break positioned below the dummy gate, the diffusion break extending to an upper surface of the buried insulator; and
a second active gate distinct from the pair of first active gates, the second active gate including an isolation separating the second active gate into two isolated active gate portions, the isolation extending to a shallow trench isolation in the SOI substrate.

13. The IC structure of claim 12, wherein the diffusion break is self-aligned with the dummy gate thereover.

14. The IC structure of claim 12, wherein the SOI layer includes a compressive stress or a tensile stress.

15. The IC structure of claim 12, further comprising a spacer between the isolation and each of the two isolated active gate portions.

16. The IC structure of claim 12, wherein the SOI substrate includes a fully depleted semiconductor-on-insulator (FDSOI) substrate, and the pair of active gates each form a p-type field effect transistor.

17. The IC structure of claim 12, wherein the pair of active gates each form an n-type field effect transistor.

18. The IC structure of claim 12, further comprising a raised source/drain region between each active gate and the dummy gate, the raised source/drain region being facet free adjacent the diffusion break.

* * * * *